United States Patent
Yonehara (10) Patent No.: US 7,341,923 B2
(45) Date of Patent: Mar. 11, 2008

(54) SUBSTRATE, MANUFACTURING METHOD THEREFOR, AND SEMICONDUCTOR DEVICE

(75) Inventor: Takao Yonehara, Kanagawa-ken (JP)

(73) Assignee: Canon Kabushiki Kaisha, Tokyo (JP)

( * ) Notice: Subject to any disclaimer, the term of this patent is extended or adjusted under 35 U.S.C. 154(b) by 401 days.

(21) Appl. No.: 11/039,845

(22) Filed: Jan. 24, 2005

(65) Prior Publication Data

US 2005/0148122 A1     Jul. 7, 2005

Related U.S. Application Data

(63) Continuation of application No. PCT/JP2004/006176, filed on Apr. 28, 2004.

(30) Foreign Application Priority Data

May 6, 2003  (JP)  ............................. 2003-128000

(51) Int. Cl.
    *H01L 21/30* (2006.01)
(52) U.S. Cl. ....................... 438/455; 438/458
(58) Field of Classification Search ................ 438/455, 438/458, 459
    See application file for complete search history.

(56) References Cited

U.S. PATENT DOCUMENTS

| | | | |
|---|---|---|---|
| 5,066,292 A | 11/1991 | Müller et al. | 606/7 |
| 5,152,761 A | 10/1992 | Muller et al. | 606/16 |
| 5,203,779 A | 4/1993 | Müller et al. | 606/7 |
| 5,371,037 A | 12/1994 | Yonehara | 437/86 |
| 5,712,199 A | 1/1998 | Nakagawa et al. | 438/62 |
| 5,750,000 A | 5/1998 | Yonehara et al. | 156/630.1 |
| 5,755,914 A | 5/1998 | Yonehara | 156/281 |
| 5,763,288 A | 6/1998 | Sakaguchi et al. | 438/455 |
| 5,840,616 A | 11/1998 | Sakaguchi et al. | 438/459 |
| 5,868,947 A | 2/1999 | Sakaguchi et al. | 216/2 |
| 5,970,361 A | 10/1999 | Kumomi et al. | 438/409 |
| 6,106,613 A | 8/2000 | Sato et al. | 117/54 |
| 6,140,209 A | 10/2000 | Iwane et al. | 438/458 |
| 6,143,628 A | 11/2000 | Sato et al. | 438/455 |
| 6,150,031 A | 11/2000 | Yonehara | 428/446 |
| 6,156,624 A | 12/2000 | Yamagata et al. | 438/459 |
| 6,190,937 B1 | 2/2001 | Nakagawa et al. | 438/67 |
| 6,211,038 B1 | 4/2001 | Nakagawa et al. | 438/409 |
| 6,258,698 B1 | 7/2001 | Iwasaki et al. | 438/455 |
| 6,306,729 B1 | 10/2001 | Sakaguchi et al. | 438/458 |
| 6,331,208 B1 | 12/2001 | Nishida et al. | 117/89 |
| 6,382,292 B1 | 5/2002 | Ohmi et al. | 156/584 |
| 6,391,743 B1 | 5/2002 | Iwane et al. | 438/458 |
| 6,429,095 B1 | 8/2002 | Sakaguchi et al. | 438/458 |
| 6,452,091 B1 | 9/2002 | Nakagawa et al. | 136/261 |

(Continued)

FOREIGN PATENT DOCUMENTS

EP    0 867 919    9/1998

(Continued)

*Primary Examiner*—Tuan H. Nguyen
(74) *Attorney, Agent, or Firm*—Fitzpatrick, Cella, Harper & Scinto (57) ABSTRACT

A step of forming the first substrate which has a separation layer and a Ge layer on the separation layer, and a step of forming a bonded substrate stack by bonding the first substrate to the second substrate through an insulating layer, and a step of dividing the bonded substrate stack at the separation layer are performed, thereby obtaining a substrate with a GOI structure.

18 Claims, 9 Drawing Sheets

U.S. PATENT DOCUMENTS

| | | |
|---|---|---|
| 6,475,323 B1 | 11/2002 | Ohmi et al. ................. 156/239 |
| 6,501,135 B1 | 12/2002 | Krivokapic ................. 257/354 |
| 6,566,235 B2 | 5/2003 | Nishida et al. ............. 438/458 |
| 6,605,518 B1 | 8/2003 | Ohmi et al. ................. 438/458 |
| 6,613,678 B1 | 9/2003 | Sakaguchi et al. .......... 438/695 |
| 6,639,327 B2 | 10/2003 | Momoi et al. ............. 257/913 |
| 6,653,209 B1 | 11/2003 | Yamagata ................... 438/459 |
| 6,677,183 B2 | 1/2004 | Sakaguchi et al. .......... 438/113 |
| 6,746,559 B2 | 6/2004 | Ohmi et al. ................. 156/239 |
| 6,756,289 B1 | 6/2004 | Nakagawa et al. ......... 438/478 |
| 6,828,214 B2 * | 12/2004 | Notsu et al. ................. 438/455 |
| 6,891,578 B2 | 5/2005 | Yonehara et al. ............. 349/43 |
| 2002/0100941 A1 | 8/2002 | Yonehara, et al. ........... 257/359 |
| 2003/0190794 A1 | 10/2003 | Ohmi, et al. ................. 438/458 |
| 2004/0082149 A1 | 4/2004 | Sakaguchi et al. .......... 438/458 |
| 2004/0171233 A1 | 9/2004 | Ohmi et al. ................. 438/458 |
| 2004/0251462 A1 | 12/2004 | Yonehara et al. ............. 257/65 |
| 2005/0124137 A1 | 6/2005 | Yonehara ..................... 438/455 |
| 2005/0148122 A1 | 7/2005 | Yonehara ..................... 438/149 |

FOREIGN PATENT DOCUMENTS

| | | |
|---|---|---|
| EP | 1 050 901 | 11/2000 |
| JP | 4-361555 | 12/1992 |
| JP | 6196674 | 7/1994 |
| JP | 2608351 | 2/1997 |
| JP | 10-326884 | 12/1998 |
| JP | 2877800 | 1/1999 |
| JP | 3048201 | 3/2000 |
| JP | 2001-015721 | 1/2001 |
| JP | 2001-168308 | 6/2001 |

* cited by examiner

SUBSTRATE, MANUFACTURING METHOD THEREFOR, AND SEMICONDUCTOR DEVICE

TECHNICAL FIELD

The present invention relates to a substrate, a manufacturing method therefor, and a semiconductor device and, more particularly, to a substrate with a GOI (Germanium-On-Insulator) structure having a Ge layer on an insulator, a manufacturing method therefor, and a semiconductor device.

BACKGROUND ART

In recent years, a substrate with an SOI (Silicon-On-Insulator) structure having an Si layer on an insulator has received attention. For example, Japanese Patent Nos. 2,608, 351, 2,877,800, and 3,048,201 each disclose a method of manufacturing such an SOI substrate.

There has recently been proposed a semiconductor device with a GOI (Germanium-On-Insulator) structure having a Ge layer on an insulator. A semiconductor device with a GOI structure is expected to be superior to a semiconductor device with an SOI structure particularly in performance speed. For example, U.S. Pat. No. 6,501,135 discloses a semiconductor device with a GOI structure and a method of manufacturing a GOI substrate. The manufacturing method disclosed in U.S. Pat. No. 6,501,135 bonds an Si substrate to an insulating film formed on a Ge substrate, thereby obtaining a GOI substrate. The GOI substrate is used to obtain a semiconductor device which employs a thin Ge film having a thickness of 500 Å as an active layer.

To obtain a semiconductor device which employs a thin Ge film as an active layer using a GOI substrate formed by bonding together a Ge substrate and an Si substrate, as disclosed in U.S. Pat. No. 6,501,135, most of the Ge substrate having a thickness of about several hundred μm needs to be removed by polishing or etching, prior to the step of forming the semiconductor device. It is difficult to control the thickness of the thin Ge film to be uniform in removing the Ge substrate by polishing or the like. Accordingly, the semiconductor device to be obtained cannot sufficiently exhibit its superiority as a device with a GOI structure. The semiconductor device is hard to manufacture at high yield, and a process of removing almost the entire part of the Ge substrate increases the manufacturing cost.

DISCLOSURE OF INVENTION

The present invention has been made on the basis of the above-mentioned background, and has as its object to provide a method of manufacturing a GOI substrate which sufficiently exhibits the superiority as a semiconductor device with a GOI structure and can ensure good economy.

According to the present invention, there is provided a method of manufacturing a substrate which has a Ge layer on an insulating layer, characterized by comprising steps of forming a first substrate which has a separation layer and a Ge layer on the separation layer, forming a bonded substrate stack by bonding the first substrate to a second substrate through an insulating layer, and dividing the bonded substrate stack at the separation layer.

Other features and advantages of the present invention will be apparent from the following description taken in conjunction with the accompanying drawings, in which like reference characters designate the same or similar parts throughout the figures thereof.

BRIEF DESCRIPTION OF DRAWINGS

The accompanying drawings, which are incorporated in and constitute a part of the specification, illustrate embodiments of the invention and, together with the description, serve to explain the principles of the invention.

BEST MODE FOR CARRYING OUT THE INVENTION

A preferred embodiment of the present invention will be described below with reference to the accompanying drawings.

FIGS. 1 to 8 are views for explaining a method of manufacturing a GOI substrate according to the preferred embodiment of the present invention. In the step shown in FIG. 1, a semiconductor substrate 11 is prepared. In the step shown in FIG. 2, a separation layer 12 is formed on the surface of the semiconductor substrate 11. As the semiconductor substrate 11, an Si substrate or Ge substrate is preferable. As the separation layer 12, a porous layer formed by anodizing the surface of the semiconductor substrate 11 is preferably used. Anodization can be performed by, e.g., arranging an anode and cathode in an electrolytic solution containing hydrofluoric acid (HF), arranging a semiconductor substrate between the electrodes, and supplying a current between them. The porous layer may be made up of a plurality of, i.e., two or more layers having different porosities.

Figure 3:
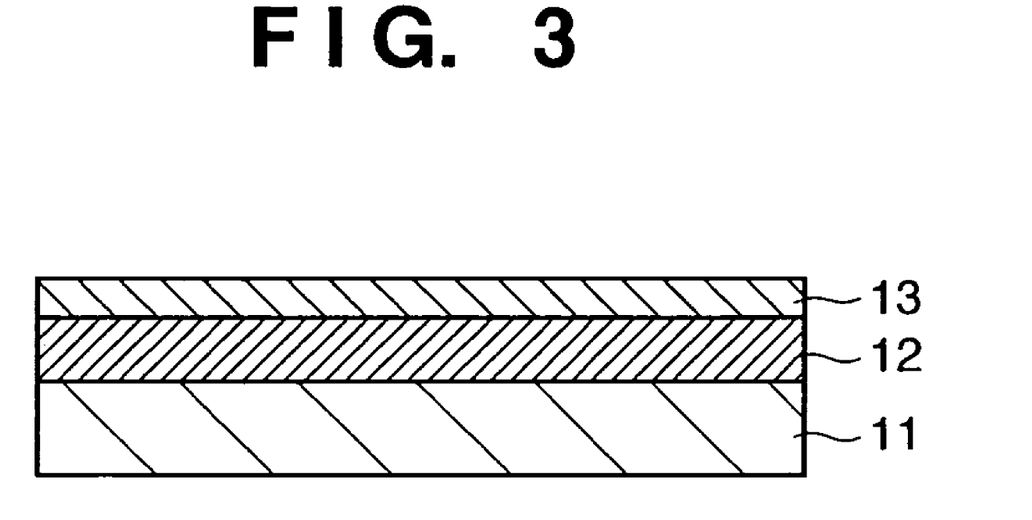
FIG. 3 is a view for explaining the substrate manufacturing method according to the preferred embodiment of the present invention.

In the step shown in FIG. 3, a Ge layer 13 is formed on the separation layer 12 by epitaxial growth. The epitaxial growth on the porous layer serving as the separation layer 12 allows the Ge layer 13 to have a uniform thickness and good crystallinity. If an Si substrate is employed as the semiconductor substrate 11, the porous Si layer 12 between the Si substrate 11 and the Ge layer 13 can relax mismatch between the lattice constant of Si and that of Ge to obtain the Ge layer 13 with good crystallinity. On the other hand, when a Ge substrate is employed as the semiconductor substrate 11, no lattice constant mismatch occurs, and the Ge layer 13 with better crystallinity can be obtained.

Figure 1:
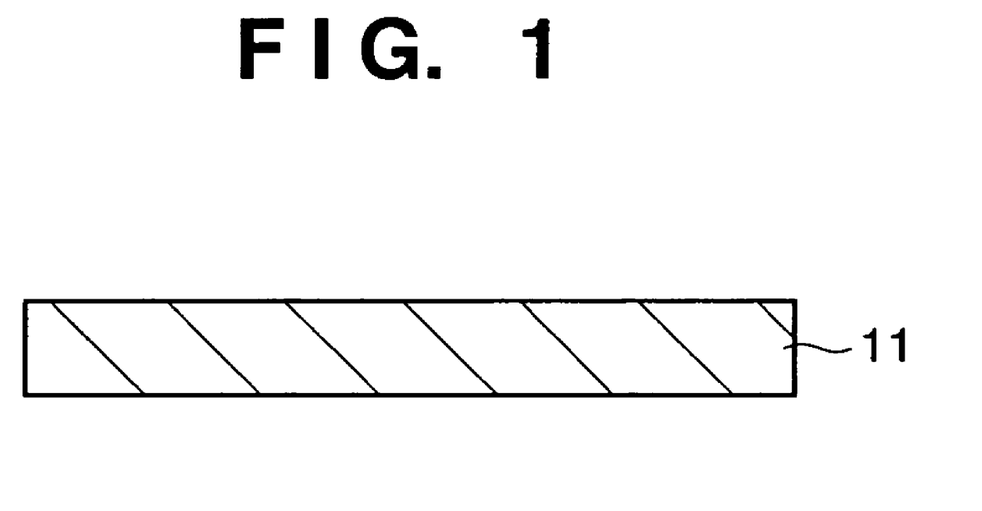
FIG. 1 is a view for explaining a substrate manufacturing method according to a preferred embodiment of the present invention.
Figure 2:
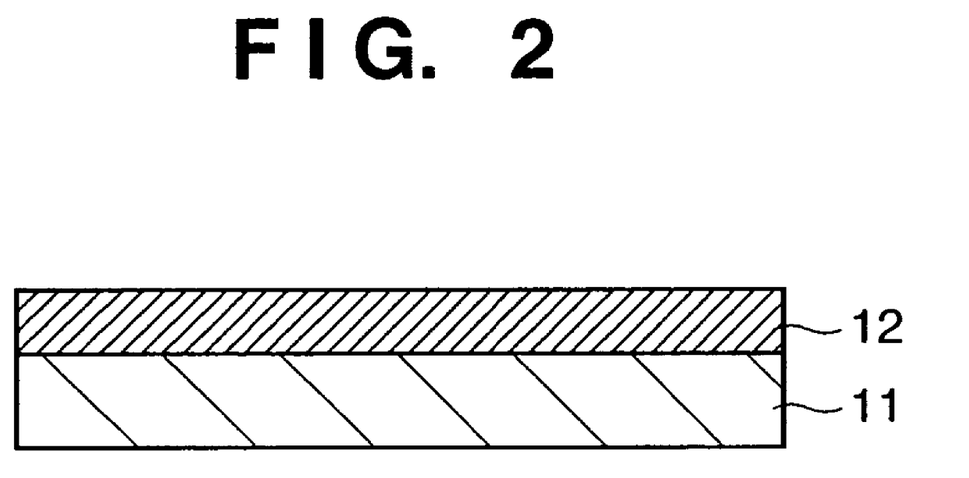
FIG. 2 is a view for explaining the substrate manufacturing method according to the preferred embodiment of the present invention.

Instead of the processes shown in FIGS. 2 and 3, for example, a method of implanting ions such as hydrogen ions at a predetermined depth from the surface of the semiconductor substrate 11 in the state shown in FIG. 1 to form an ion-implanted layer as the separation layer 12 may be adopted. In this case, a Ge substrate is preferably employed as the semiconductor substrate 11, and a portion on the surface side as viewed from the separation layer 12 serves as the Ge layer 13.

Figure 4:
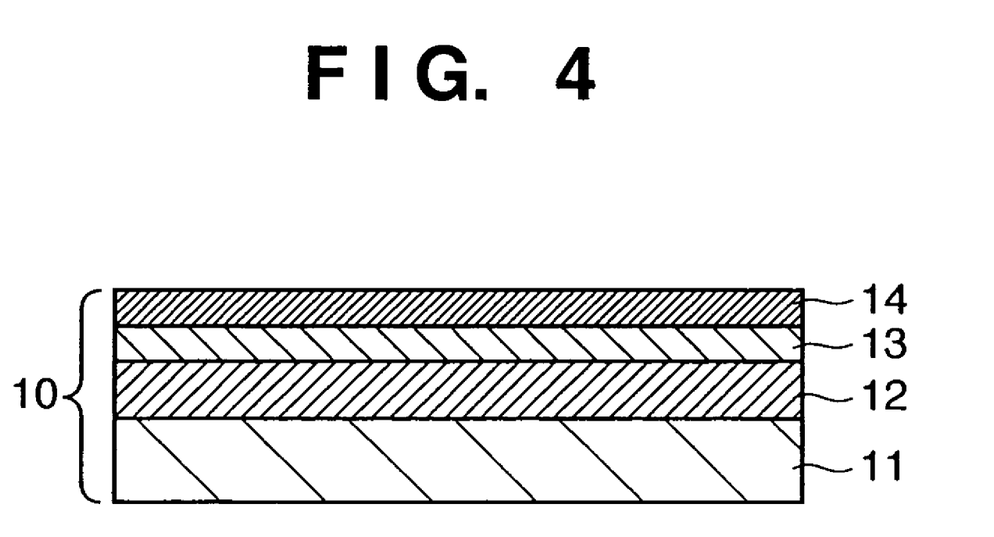
FIG. 4 is a view for explaining the substrate manufacturing method according to the preferred embodiment of the present invention.

In the step shown in FIG. 4, an insulating layer 14 is formed on the Ge layer 13. In the above-mentioned manner, a first substrate 10 having the Ge layer 13 on the porous layer or ion-implanted layer serving as the separation layer 12 is formed. As the insulating layer 14, silicon dioxide ($SiO_2$) can be used. Other preferable examples of the insulating layer 14 include an oxide film of silicon oxynitride (SiON), aluminum oxide ($Al_2O_3$), hafnium oxide ($HfO_2$), zirconium oxide ($ZrO_2$), tantalum oxide ($Ta_2O_5$), and the like.

Figure 5:
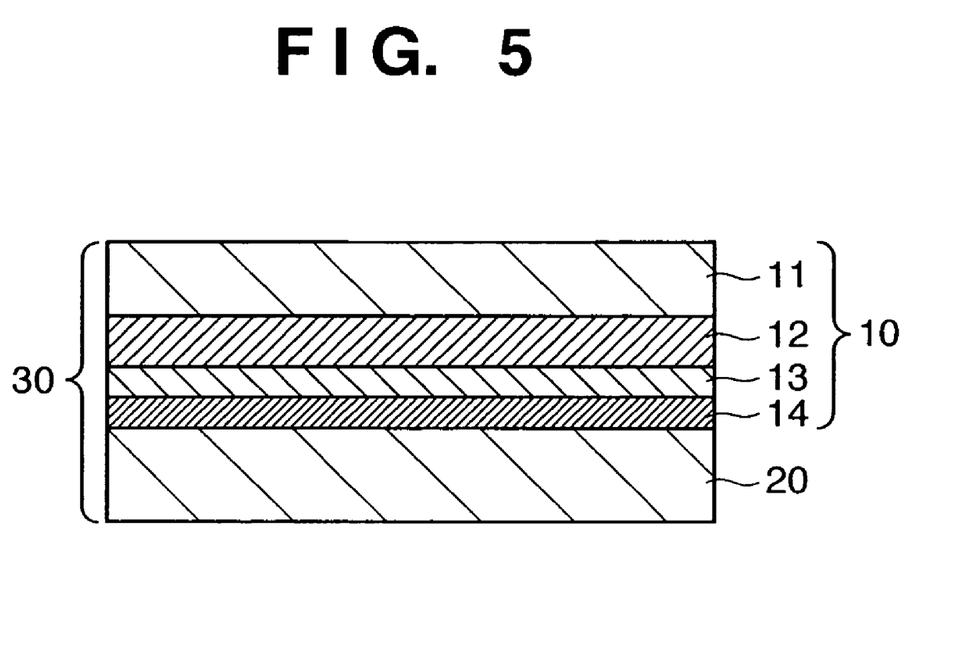
FIG. 5 is a view for explaining the substrate manufacturing method according to the preferred embodiment of the present invention.

In the step shown in FIG. 5, a second substrate 20 is bonded to the surface of the first substrate 10 shown in FIG. 4 to form a bonded substrate stack 30. Typically, an Si substrate or a substrate obtained by forming an insulating film such as an $SiO_2$ layer on its surface is preferably employed as the second substrate 20. Also, any other substrate such as a glass substrate may be employed as the second substrate 20.

Figure 6:
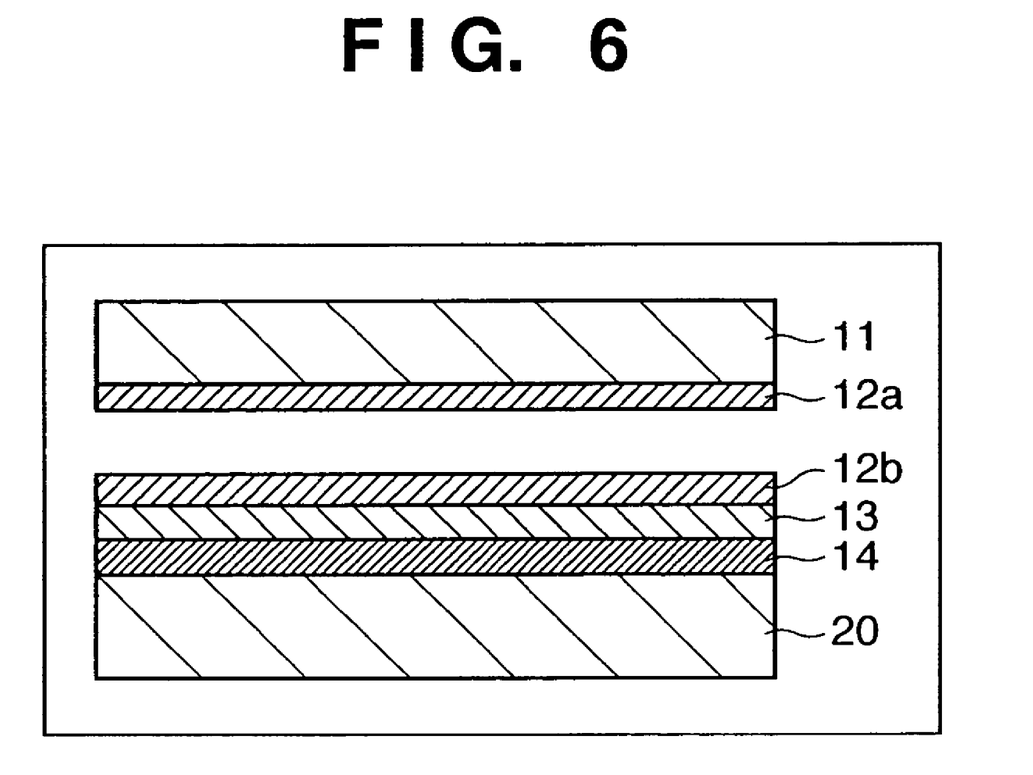
FIG. 6 is a view for explaining the substrate manufacturing method according to the preferred embodiment of the present invention.

In the step shown in FIG. 6, the bonded substrate stack 30 is divided into two substrates by cutting it at the separation layer 12. This division can be performed by, e.g., a method of using a fluid. As the method, a method of forming a jet of a fluid (liquid or gas) and injecting the jet to the separation layer 12, a method which utilizes the static pressure of a fluid, or the like is preferably employed. Out of jet injection methods, a method using water as the fluid is called a wafer jet method. The division can also be performed by annealing the bonded substrate stack 30. Such division by annealing is particularly effective when an ion-implanted layer is formed as the separation layer 12. Alternatively, the division may be performed by inserting a solid member such as a wedge into the separation layer 12.

Figure 7:
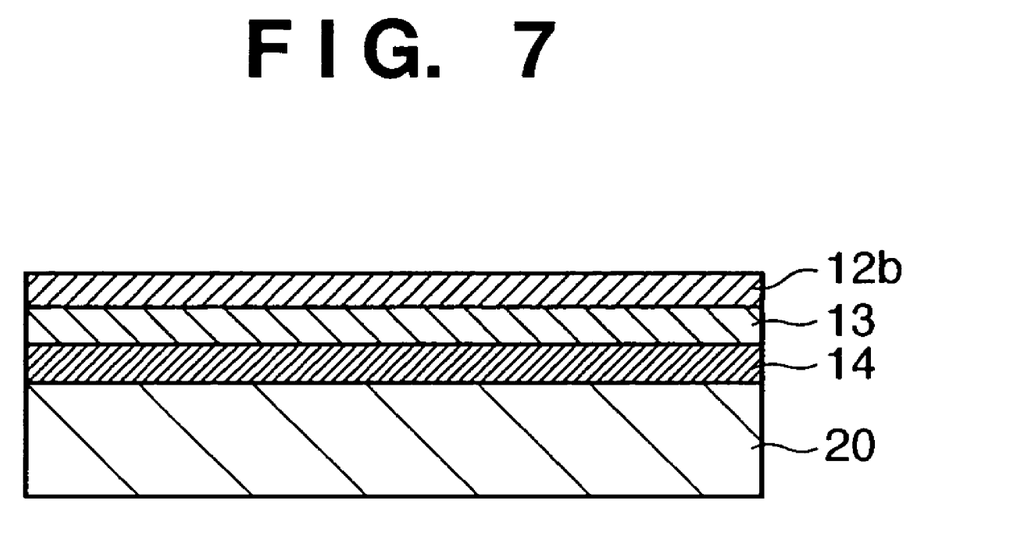
FIG. 7 is a view for explaining the substrate manufacturing method according to the preferred embodiment of the present invention.

In the step shown in FIG. 7, a separation layer 12b left on the Ge layer 13 of the second substrate 20 is removed using an etchant or the like. At this time, the Ge layer 13 is preferably used as an etching stopper layer. Then, a planarization step such as a hydrogen annealing step, polishing step, or the like may be performed as needed to planarize the Ge layer 13.

Figure 8:
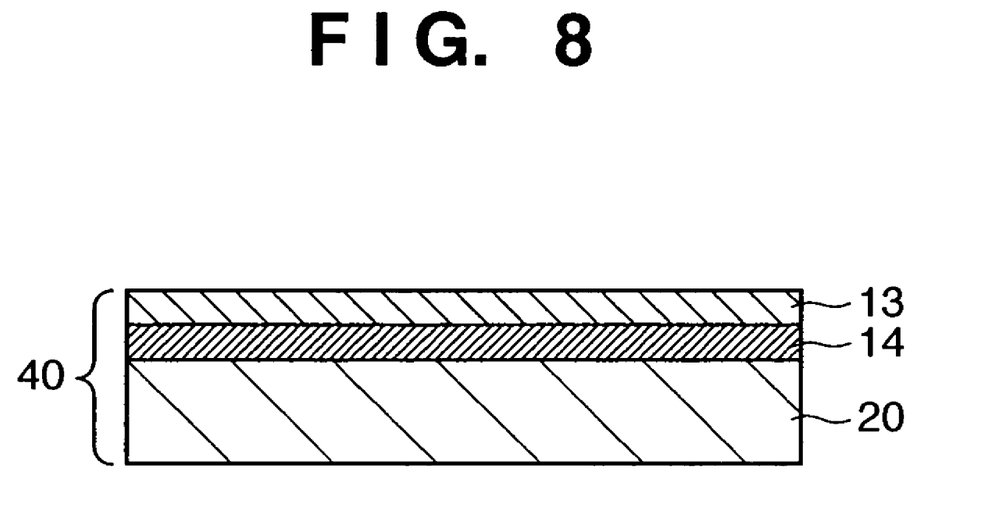
FIG. 8 is a view for explaining the substrate manufacturing method according to the preferred embodiment of the present invention.

With the above-mentioned operation, a semiconductor substrate 40 shown in FIG. 8 is obtained. The semiconductor substrate 40 shown in FIG. 8 has the thin Ge layer 13 on its surface and the insulating. layer 14 immediately below the Ge layer 13. The expression "thin Ge layer" is intended to mean a layer thinner than a general semiconductor substrate. To exhibit the superiority as a semiconductor device, the thickness of the Ge layer 13 preferably falls within a range of 5 nm to 2 µm. A gallium arsenide (GaAs) layer can be formed on the Ge layer 13, depending on the specifications of the semiconductor device. Since mismatch between the lattice constant of Ge and that of GaAs is small, a GaAs layer with good crystallinity can be obtained.

After the bonded substrate stack 30 is divided in the step shown in FIG. 6, a separation layer 12a left in the first substrate 10 is removed using an etchant or the like. Then, the hydrogen annealing step, polishing step, or the like may be performed to planarize the first substrate 10. The planarized substrate may be reused as the semiconductor substrate 11 to be used in the step shown in FIG. 1. Repeated use of the semiconductor substrate 11 can greatly reduce the manufacturing cost of a GOI substrate.

As has been described above, the manufacturing method according to the present invention makes it possible to obtain a GOI substrate which has a thin Ge film with a uniform thickness and good crystallinity. Also, the manufacturing method according to the present invention can greatly reduce the manufacturing cost of a GOI substrate.

EXAMPLES

Preferred examples of the present invention will be described below.

Example 1

A first p-type Si substrate 11 with a resistivity of 0.01 Ω·cm was prepared. Then, the first Si substrate 11 was anodized in an anodizing solution to form a porous Si layer serving as a separation layer 12. The anodizing conditions were as follows.

Current density: 7 ($mA/cm^2$)
Anodizing solution: $HF:H_2O:C_2H_5OH=1:1:1$
Time: 11 (min)
Thickness of porous silicon: 12 (µm)

The current density and the concentrations of the respective components of the anodizing solution can appropriately be changed in accordance with the thickness, structure, and the like of the separation layer (porous Si layer) 12 to be formed. Preferably, the current density falls within a range of 0.5 to 700 $mA/cm^2$, and the ratio between the concentrations of the components of the anodizing solution falls within a range of 1:10:10 to 1:0:0.

The porous Si layer is useful because a high-quality epitaxial Ge layer is formed thereon, and the porous Si layer functions as the separation layer. The thickness of the porous Si layer is not limited to that of the above example. Good results can be obtained as far as the thickness falls within a range of, e.g., 0.1 µm to several hundred µm.

The anodizing solution only needs to contain HF and need not contain ethanol. Ethanol, however, is useful for removing any air bubbles from the surface of the substrate and is preferably added to the anodizing solution. Examples of a chemical agent which has a function of removing air bubbles include, e.g., alcohols such as methyl alcohol and isopropyl alcohol, a surfactant, and the like in addition to ethanol. Instead of adding these chemical agents, air bubbles may be eliminated from the substrate surface by vibrations of ultrasonic waves or the like.

The anodized substrate was oxidized in an oxygen atmosphere at 400° C. for 1 hr. With this oxidation step, the inner walls of pores of the porous Si layer were covered with a thermally oxidized film. A Ge layer 13 having a thickness of 0.3 µm is epitaxially grown on the porous Si layer by chemical vapor deposition (CVD). The growth conditions were as follows.

Source gas: $GeH_4/H_2$
Gas flow rate: 0.5/180 L/min
Gas pressure: 80 Torr
Temperature: 600° C.
Growth rate: 0.3 µm/min Note that these growth conditions can appropriately be changed in accordance with required specifications of the Ge layer 13.

Then, Zr was deposited to a thickness of 200 nm on the surface of the epitaxial Ge layer 13 by sputtering in an ultrahigh vacuum at room temperature. The first Si substrate 11 was oxidized with ozone in situ in the same chamber to form a $ZrO_2$ layer 14.

The surface of a first substrate 10 and that of a second substrate 20 were put together and brought into contact with each other. The first substrate 10 and second substrate 20 were subjected to annealing at 800° C. for 5 min, thereby increasing the bonding strength. With this operation, a bonded substrate stack 30 was obtained.

Pure water was injected from a 0.1-mm nozzle of a water jet apparatus toward a concave portion (concave portion formed by the beveled portions of the two substrates 10 and 20) of the periphery of the bonded substrate stack 30 in a direction parallel to the bonding interface of the bonded substrate stack 30 at a high pressure of 50 MPa. With this operation, the bonded substrate stack 40 was cut at the separation layer 12 and divided into two substrates. The pressure of the pure water preferably falls within a range of, e.g., several MPa to 100 MPa.

In this division step, any one of the following operations may be performed.

(1) The nozzle performs scanning such that a jet of pure water injected from the nozzle moves along the concave portion formed by the beveled portions.

(2) The bonded substrate stack 30 is held by a wafer holder and rotates on its axis to inject pure water into the concave portion formed by the beveled portions around the periphery of the bonded substrate stack.

(3) The operations (1) and (2) are performed in combination.

Consequently, the $ZrO_2$ layer 14, epitaxial Ge layer 13, and a part 12b of the porous Si layer 12, which were originally formed on the side of the first substrate 10 were transferred to the side of the second substrate 20. Only the porous Si layer 12a was left on the surface of the first substrate 10.

Instead of dividing (separating) the bonded substrate stack by a water jet method, a jet of gas may be used or a solid wedge may be inserted into the separation layer of the bonded substrate stack. Alternatively, a mechanical force such as a tensile force, shearing force, or the like may be applied to the bonded substrate stack or ultrasonic waves may be applied to the bonded substrate stack. In addition, any other method may be adopted.

The porous Si layer 12b which was transferred to the uppermost surface of the second substrate 20 was selectively etched using an etchant in which at least a 49% hydrofluoric acid (HF) solution, a 30% hydrogen peroxide ($H_2O_2$) solution, and water ($H_2O$) were mixed. The Ge layer 13 was left unetched while the porous Si layer 12b was selectively etched and completely removed. If the selective etching is performed while rotating the substrate and starting/stopping generating ultrasonic waves using an apparatus combined with a circulator which circulates the etchant, non-uniform etching on the surface of each substrate and among substrates can be suppressed. Additionally, if an alcohol or surfactant is mixed with the etchant, unevenness in etching caused by reactive air bubbles on the surface can be suppressed.

The etching speed of the Ge layer with the etchant is extremely low, and the selectivity ratio to the etching speed of the porous layer reaches $10^5$ or more. The etching amount in the Ge layer can practically be neglected.

With the above-mentioned steps, a semiconductor substrate which has the Ge layer 13 with a thickness of 0.3 μm on the $ZrO_2$ layer 14 was obtained. Although the porous Si layer was selectively etched, no change occurred in the Ge layer 13. When the film thickness of the formed Ge layer 13 was measured at 100 points across the surface, the uniformity of the film thickness was 301 nm±4 nm.

The observation of the cross section with a transmission electron microscope showed that the Ge layer 13 maintained good crystallinity.

Furthermore, the substrate was subjected to annealing in a hydrogen atmosphere at 600° C. for 1 hr, and the surface roughness of Ge was evaluated with an atomic force microscope. The mean square roughness in a 50-μm-square region was about 0.2 nm, which was equivalent to that of a commercially available Si wafer.

The surface may be planarized by polishing such as CMP, instead of hydrogen annealing.

If plasma processing is performed for at least one of respective surfaces to be bonded of the first and second substrates as a preprocess of the bonding step, the bonding strength can be increased even by annealing at a low temperature. Additionally, a substrate having undergone plasma processing is preferably washed with water.

In the division step, a plurality of bonded substrate stacks may be arranged in their planar direction, and a nozzle of a water jet apparatus may perform scanning along the planar direction, thereby continually dividing the plurality of bonded substrate stacks.

Alternatively, a plurality of bonded substrate stacks may be arranged in a direction perpendicular to each plane, and a nozzle of a water jet apparatus may be provided with an X-Y scanning function. Then, a jet of water may sequentially be injected toward a plurality of bonding portions of the bonded substrate stack, and the bonded substrate stacks may automatically be divided.

After the division step, the porous Si layer 12a left on the first substrate 10 was removed, and the first substrate 10 was subjected to planarization. Reuse of the planarized substrate in the formation step of the first substrate can reduce the manufacturing cost of a GOI substrate. Repeated reuse can greatly reduce the manufacturing cost of the GOI substrate.

Example 2

This example is an improved example of Example 1 and is the same as Example 1 except for anodizing conditions.

In this example, an Si substrate 11 was prepared and anodized in a solution containing HF under either of the following anodizing conditions.

(First Anodizing Condition)

(First Step)
Current density: 8 (mA/cm$^2$)
Anodizing solution: HF:$H_2O$:$C_2H_5OH$=1:1:1
Time: 11 (min)
Thickness of porous silicon: 13 (μm)

(Second Step)
Current density: 22 (mA/cm$^2$)
Anodizing solution: HF:$H_2O$:$C_2H_5OH$=1:1:1
Time: 2 (min)
Thickness of porous silicon: 3 (μm)

or (Second Anodizing Condition)

(First Step)
Current density: 8 (mA/cm$^2$)
Anodizing solution: HF:H$_2$O:C$_2$H$_5$OH=1:1:1
Time: 5 (min)
Thickness of porous silicon: 6 (μm)

(Second Step)
Current density: 33 (mA/cm$^2$)
Anodizing solution: HF:H$_2$O:C$_2$H$_5$OH=1:1:1
Time: 1.3 (min)
Thickness of porous silicon: 3 (μm)

The first porous Si layer to be formed at the first step of the anodization is used to form a high-quality epitaxial Ge layer thereon. The second porous Si layer to be formed under the first porous Si layer at the second step of the anodization is used as a separation layer.

Example 3

Figure 9:
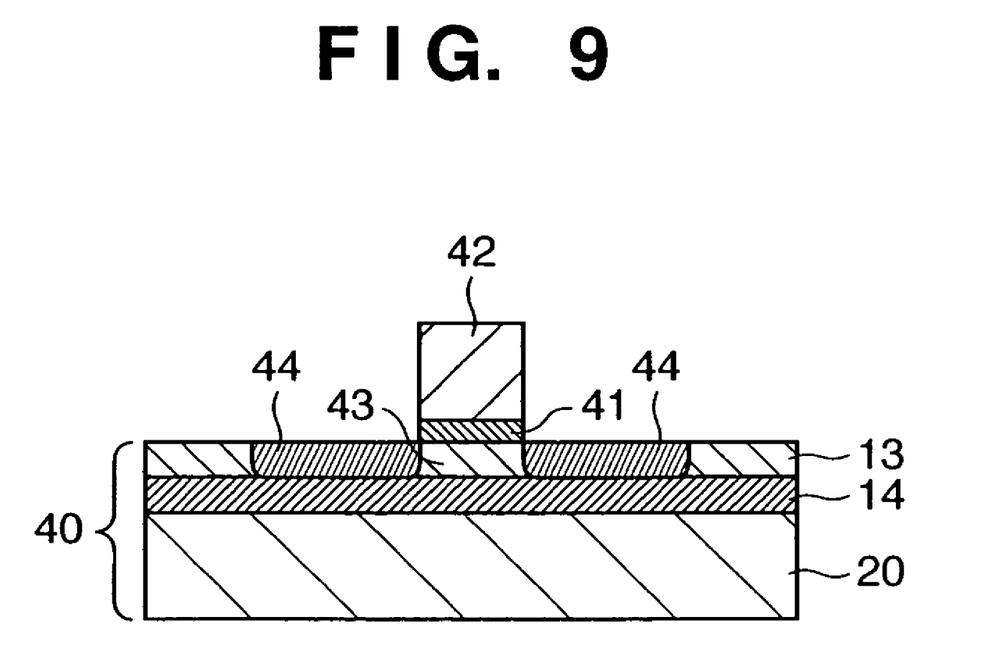
FIG. 9 is a view for explaining a semiconductor device according to the preferred embodiment of the present invention.

An FET with the structure shown in FIG. 9 was formed on a semiconductor substrate manufactured by each of the methods described in Examples 1 and 2. A gate insulating film 41 made of zirconium oxide (ZrO$_2$), a gate electrode 42 made of porous silicon, a channel region 43, and a source and drain region 44 were formed in a semiconductor substrate 40 with a GOI structure which has a Ge layer 13 on an insulating layer 14 made of zirconium oxide (ZrO$_2$). As the gate insulating film 41, an oxide film of, e.g., aluminum oxide (Al$_2$O$_3$), hafnium oxide (HfO$_2$), tantalum oxide (Ta$_2$O$_5$), or the like may preferably be used in addition to zirconium oxide (ZrO$_2$). In this example, the FET was formed on the semiconductor substrate manufactured by each of the methods described in Examples 1 and 2. The present invention, however, is not limited to this, and other semiconductor devices such as a transistor, diode, LSI, and the like can be formed.

Other Example

Various film forming techniques such as CVD, MBE, sputtering, liquid phase growth can be applied to an epitaxial growth step for forming a Ge layer.

Also, various other etchants (e.g., a mixture of a hydrofluoric acid solution, nitric acid solution, and acetic acid solution) can be applied to a step of selectively etching a separation layer (porous layer, ion implantation layer, or the like) left upon division, in addition to a mixture of a 49% hydrofluoric acid solution, a 30% hydrogen peroxide solution, and water as described above.

As many apparently widely different embodiments of the present invention can be made without departing from the spirit and scope thereof, it is to be understood that the invention is not limited to the specific embodiments thereof except as defined in the appended claims.

The invention claimed is:

1. A method of manufacturing a substrate which has a Ge layer on an insulating layer, comprising the steps of:

forming a first substrate which has a Ge substrate, a separation layer on the Ge substrate, and an epitaxial Ge layer on the separation layer;

forming a bonded substrate stack by bonding the first substrate to a second substrate through the insulating layer; and dividing the bonded substrate stack at the separation layer.

2. The method according to claim 1, wherein the insulating layer is formed on the epitaxial Ge layer.

3. The method according to claim 1, wherein the insulating layer is formed on the second substrate.

4. The method according to claim 1, wherein the separation layer is formed by porosifying a semiconductor substrate by anodization.

5. The method according to claim 1, wherein the separation layer is formed by implanting ions in a semiconductor substrate.

6. The method according to claim 1, wherein the insulating layer includes an oxide film.

7. The method according to claim 1, wherein the insulating layer contains silicon dioxide (SiO$_2$).

8. The method according to claim 1, wherein the insulating layer contains at least one of silicon oxynitride (SiON), aluminum oxide (Al$_2$O$_3$), hafnium oxide (HfO$_2$), zirconium oxide (ZrO$_2$), and tantalum oxide (Ta$_2$O$_5$).

9. The method according to claim 1, wherein the division step includes a step of dividing the separation layer by a jet of a fluid or a static pressure.

10. The method according to claim 1, wherein the division step includes a step of dividing the separation layer by annealing the bonded substrate stack.

11. The method according to claim 1, wherein the division step includes a step of dividing the separation layer by inserting a member into the separation layer.

12. The method according to claim 1, further comprising a step of removing a part of the separation layer left on the epitaxial Ge layer on the second substrate after the division step.

13. The method according to claim 1, further comprising a step of planarizing a surface of the epitaxial Ge layer after the division step.

14. The method according to claim 1, further comprising a step of removing a part of the separation layer left on the first substrate after the division steps.

15. The method according to claim 1, further comprising a step of planarizing a surface of the first substrate and reusing the planarized first substrate in the step of fanning the first substrate after the division step.

16. A substrate which is manufactured by a method of manufacturing a substrate as defined in claim 1.

17. A semiconductor device which is manufactured using a substrate which is manufactured by a method of manufacturing a substrate as defined in claim 1.

18. The method according to claim 1, further comprising a step of performing hydrogen annealing or polishing to planarize the first substrate after the division step.

* * * * *

UNITED STATES PATENT AND TRADEMARK OFFICE
CERTIFICATE OF CORRECTION

PATENT NO.        : 7,341,923 B2
APPLICATION NO.   : 11/039845
DATED             : March 11, 2008
INVENTOR(S)       : Takao Yonehara It is certified that error appears in the above-identified patent and that said Letters Patent is hereby corrected as shown below:

COLUMN 8:
  Line 44, "steps." should read -- step. --; and
  Line 47, "fanning" should read -- forming --.

Signed and Sealed this

Eleventh Day of November, 2008

JON W. DUDAS
*Director of the United States Patent and Trademark Office*